United States Patent
Nuxoll et al.

(10) Patent No.: US 6,446,951 B2
(45) Date of Patent: Sep. 10, 2002

(54) ADJUSTABLE COARSE ALIGNMENT TOOLING FOR PACKAGED SEMICONDUCTOR DEVICES

(75) Inventors: Jim Nuxoll; Julian Aberasturi, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/862,392

(22) Filed: May 21, 2001

Related U.S. Application Data

(62) Division of application No. 09/321,266, filed on May 27, 1999.

(51) Int. Cl.⁷ .................................................. B25B 5/02
(52) U.S. Cl. ...................................... 269/118; 269/903
(58) Field of Search ............................. 414/749.1, 754, 414/756, 763, 772, 774, 783; 269/118, 903

(56) References Cited

U.S. PATENT DOCUMENTS

| | | | |
|---|---|---|---|
| 3,466,514 A | 9/1969 | Brunner et al. ................ 318/18 |
| 3,739,247 A | 6/1973 | Yamaguchi et al. .......... 318/640 |
| H422 H | 2/1988 | Daniels et al. ............... 414/763 |
| 4,948,330 A | 8/1990 | Nomura et al. .............. 414/749 |
| 5,017,056 A | 5/1991 | Morash .......................... 408/1 |
| 5,307,978 A | 5/1994 | Ricketson et al. ............. 228/4.5 |
| 5,422,579 A | 6/1995 | Yamaguchi ................... 324/758 |
| 5,521,522 A | * 5/1996 | Abe et al. .................... 324/758 |
| 5,644,245 A | * 7/1997 | Saitoh et al. ................ 324/754 |
| 5,971,256 A | 10/1999 | Fogal et al. .................. 228/212 |
| 6,043,667 A | * 3/2000 | Cadwallader et al. ........ 324/758 |
| 6,089,107 A | 7/2000 | Canella et al. .............. 73/865.8 |
| 6,128,074 A | 10/2000 | Hong et al. ............... 356/237.1 |
| 6,139,251 A | 10/2000 | Chu ............................ 414/783 |

* cited by examiner

*Primary Examiner*—Janice L. Krizek
(74) *Attorney, Agent, or Firm*—Dorsey & Whitney LLP

(57) ABSTRACT

An apparatus and method for positioning packaged semiconductor devices having different rectangular shapes and sizes. A positioning apparatus includes an adjustable alignment guide releasably coupled to a base. The adjustable alignment guide may be positioned along a first axis to partially define a recess into which the packaged semiconductor devices are placed during positioning. The positioning apparatus may also include additional adjustable alignment guides that may be positioned along the first or a second axis to further define the recess into which the packaged semiconductor device is to be placed during positioning. The adjustable alignment guides may have alignment surfaces against which the integrated circuit rests when placed into the recess that is partially defined by the alignment surfaces. The adjustable alignment guides may be slidably attached to a base, and moved by sliding the guides to an appropriate position according to the shape and size of the packaged semiconductor device to be positioned.

34 Claims, 6 Drawing Sheets

ADJUSTABLE COARSE ALIGNMENT TOOLING FOR PACKAGED SEMICONDUCTOR DEVICES

CROSS-REFERENCE TO RELATED APPLICATION

This application is a divisional of pending U.S. patent application Ser. No. 09/321,266, filed May 27, 1999.

TECHNICAL FIELD

The present invention relates generally to the field of semiconductor device manufacturing, and more particularly, to an apparatus and method of coarsely aligning a packaged semiconductor device.

BACKGROUND OF THE INVENTION

Semiconductor devices are typically fabricated on thin wafers of silicon. Several die are produced on each wafer, with each die representing a single semiconductor device. Each die on a wafer is tested for gross functionality, and sorted according to whether the die passes or fails the gross functionality test. After being sorted according to gross functionality, the wafers are cut using a wafer saw and the individual die are separated. The die determined to be non-functional are scrapped. The functional die are packaged and further tested to ensure that each packaged device satisfies a minimum level of performance. The reliability of the packaged devices are tested by further subjecting them to a "burn-in" period where the devices are tested at an elevated voltage and elevated temperature for a period of time.

Functional devices may be permanently packaged by encapsulating the die in a plastic package, or temporarily packaged by mounting the die in a ceramic package. Packaging the functional devices facilitates handling of the device and also protects the die from damage during performance and reliability testing. The packaged devices are typically stored in carrying trays having recesses into which the device is placed. The packaged devices are transported from one test station to another in the carrying trays.

Automated device handlers are used during the testing and burn-in phase to facilitate handling of the packaged devices. The handlers automatically unload the packaged devices from the carrying trays, and transport and position the devices for testing by a test unit. The handler then reloads the packaged devices into a carrying tray when testing is complete.

When unloading a packaged device from a carrying tray, the handler may need to align the packaged device prior to placing it into a handler boat. Although the carrying tray provides some alignment, it may not be within the precision required for placement into the handler boat without damaging the packaged device. A mechanical structure known as a precisor is used to coarsely align the packaged device. The packaged device is placed into a recess in the precisor for alignment. The packaged device is then removed from the precisor and placed into the handler boat to be transported within the automated device handler to a handler chuck.

The handler chuck receives the packaged device from the handler boat and positions it to come in contact with a contactor. The contactor has a series conductors that electrically contact the leads of the packaged device. A tester unit connected to the contactor applies a series of signals to the packaged device through the series of conductors in order to test the functionality of the device. Before the handler chuck puts the packaged device into contact with the contactor, the packaged device must be correctly oriented. Although the contactor is designed to receive a packaged device that is not precisely oriented to the contactor, the packaged device must still be coarsely aligned within a certain measure. An incorrectly oriented packaged device may be damaged when forced into contact with the contactor, or incorrectly tested when the leads of the packaged device contact the incorrect conductors because the device is misaligned with respect to the contactor.

After testing is complete, the packaged device is pulled away from the contactor by the handler chuck and returned to the handler boat. The packaged device is transported by the handler boat to be reloaded into a carrying tray.

Shown in FIG. 1 is an example of a conventional fixed alignment tooling 2 used for coarsely aligning a packaged device 3. The fixed alignment tooling 2 may be used in the singulated device handling applications described previously, that is, for a precisor, or handler boat or chuck. The fixed tooling 2 includes a base 4 having a recess 6 defined by chambered surfaces 8a–d. The packaged device 3 is coarsely aligned by the chambered surfaces when placed into the recess 6 and rests on either on the package balls or on the package substrate if relief for the ball pattern is provided. The chambered surfaces 8a–d also guide the packaged device 3 into the recess 6 when slightly skewed and facilitate positioning of the packaged device 3 within the recess 6. The coarsely aligned packaged device 3 can then be transported or transferred within the automatic handler positioned with the proper alignment.

It can be seen that the fixed tooling 2 works only for a packaged device having a particular shape and size. The fixed alignment tooling 2 requires replacement when the shape or size of the packaged device changes. The costs involved with changing the fixed tooling 2 is considerable when refitting an entire test area. For example, the fixed tooling of the precisor, handler boats and chucks would need to be retrofitted to accommodate a packaged device having a new shape or size. Fortunately, the need to change the fixed tooling 2 arises infrequently because the shape and size of current device package types, for example, SOJ, ZIP, or TSOP packages, are not affected when the size of the die encapsulated within the package is decreased.

The die size of a semiconductor device is typically shrunk in an effort to increase the number of die fabricated on each wafer, and consequently, increase the number of die potentially yielded by each wafer. Die shrinks occur throughout the lifetime of a semiconductor device. The shape and size of the package is generally unaffected by a die shrink because each succeeding generation of smaller die are simply encapsulated in the same sized package as their larger progenitor. Thus, the infrequency of changing the fixed tooling 2 allows for the associated costs to be amortized over a relatively long period of time. However, as the shape or size of device packages change more frequently during the lifetime of a device, the relative costs will increase. Therefore, it can be appreciated that there is a need for an apparatus that can coarsely align packaged semiconductor devices and minimize the costs associated with changing the fixed toolings whenever the size of the device package changes.

SUMMARY OF THE INVENTION

The present invention is directed to an apparatus and method for positioning packaged semiconductor devices having different rectangular shapes and sizes. A positioning apparatus includes an adjustable alignment guide that may be positioned along a first axis to partially define a recess into which the packaged semiconductor devices are placed during positioning. The adjustable alignment guide may be an alignment surface against which the integrated circuit rests when placed into the recess partially defined by the alignment surface. The adjustable alignment guide may be slidably attached to a base, and moved by sliding the guide to the appropriate position according to the shape and size of the packaged semiconductor device to be positioned. The positioning apparatus may also include additional adjustable alignment guides that may be positioned along the first or a second axis to further define the recess into which the packaged semiconductor device is to placed during positioning.

DETAILED DESCRIPTION OF THE INVENTION

As discussed previously, the fixed alignment tooling must be changed whenever the shape or size of the package device changes. As the frequency with which the package shape or size changes increases, the relative costs associated with re-fitting singulated device handling equipment with new fixed alignment toolings will also increase. Exacerbating this problem is the fact that the frequency with which die shrinks occur has accelerated as a result of a greater demand for smaller and faster semiconductor devices.

Additionally, new package types are currently being developed that have shapes and sizes that are affected by the size of the encapsulated die. For example, fine pitch ball grid array (FBGA) packages, and other chip scale packages (CSPs) have package dimensions that are slightly larger than the dimension of the encapsulated die. Therefore, each time a die shrink occurs, the size of the resulting packaged device also decreases. Consequently, the fixed alignment tooling must be changed to accommodate the smaller sized package each time a die shrink occurs. As mentioned previously, die shrinks are occurring more frequently during the lifetime of a semiconductor device.

Figure 1:
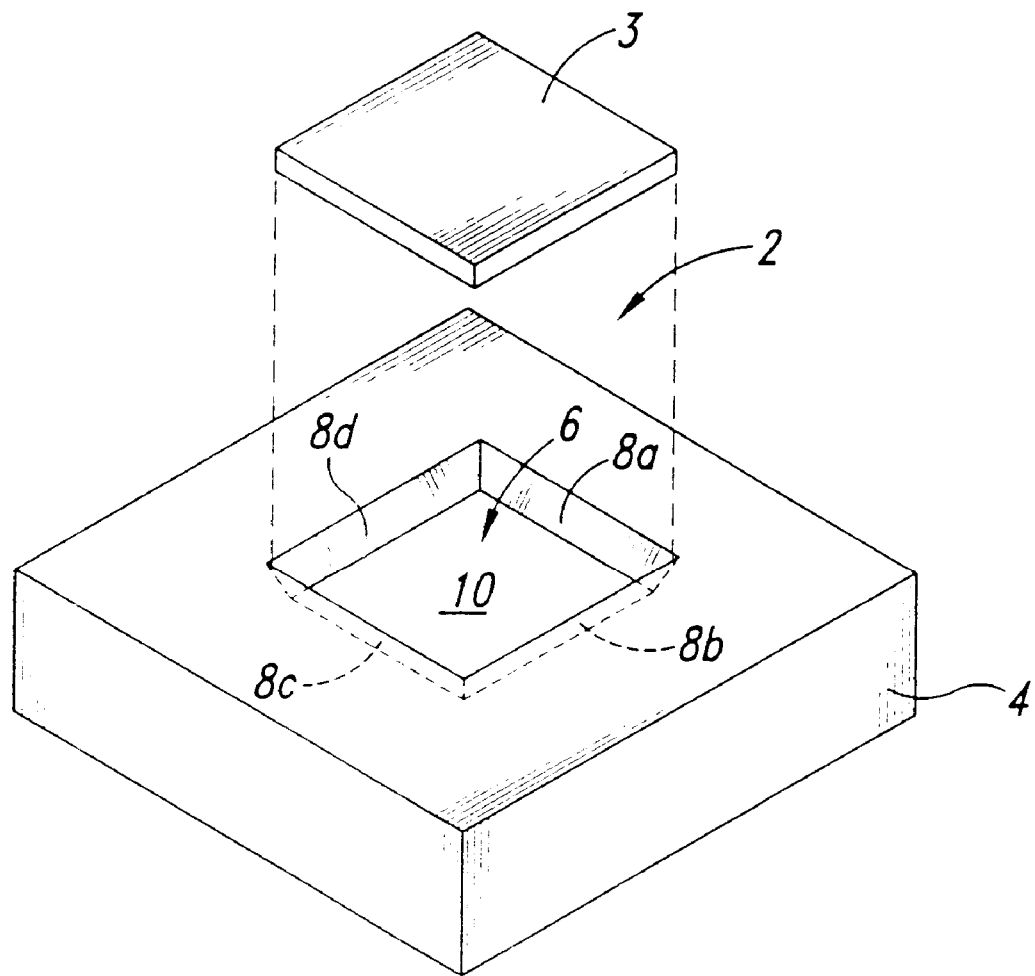
FIG. 1 is an isometric view of a conventional coarse alignment tooling.
Figure 2:
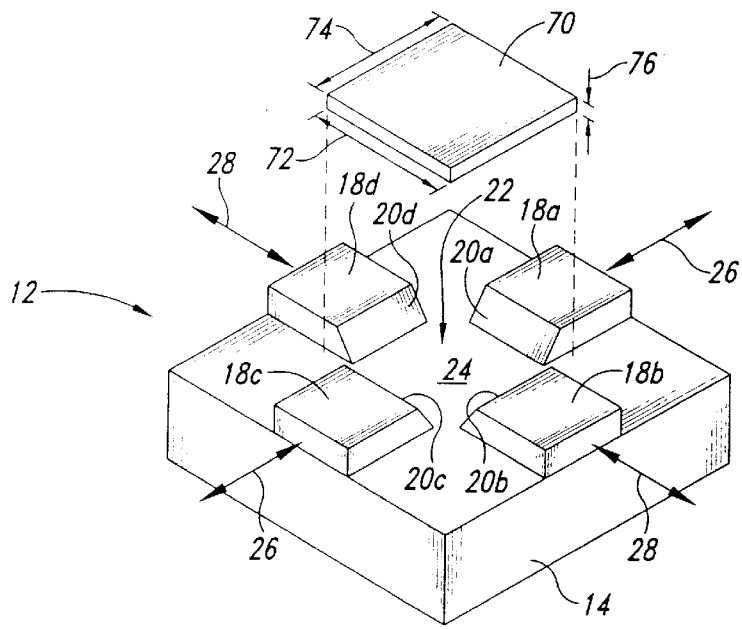
FIG. 2 is an isometric view of a coarse alignment tooling according to an embodiment of the present invention.

The present invention is embodied in an adjustable alignment tooling 12 shown in FIG. 2. The adjustable alignment tooling 12 may be used in precising systems utilized in singulated device handling equipment, such as those discussed above. The adjustable alignment tooling 12 may be adjusted to accommodate various package shapes, thus reducing the need to replace the fixed alignment tooling whenever the shape or size of the device package changes. The adjustable alignment tooling 12 is especially useful in light of the recent development in CSPs.

The adjustable alignment tooling 12 includes a base 14 and adjustable alignment fixtures 18a–d attached to the base 14. Each of the adjustable alignment fixtures 18a–d has a respective alignment surface 20a–d. The adjustable alignment fixtures 18a–d are adjusted so that the respective alignment surfaces 20a–d define a recess 22 into which the packaged semiconductor device is placed for coarse alignment. The alignment surfaces 20a–d are chamfered to facilitate placement of the packaged semiconductor into the recess 22 during alignment. Once the packaged semiconductor has been placed into the recess 22, the packaged semiconductor device is coarsely aligned to the correct orientation. In the case where the packaged semiconductor device is in the form of a ball grid array ("BGA"), the device will rest on either the solder balls, or on the package substrate if relief for the solder ball pattern (not shown) is provided.

The adjustable alignment fixtures 118a, 18c and 18b, 18d may be adjusted along two perpendicular axes 26 and 28, respectively, to accommodate coarse alignment of packaged semiconductor devices having different rectangular shapes and sizes. The adjustable alignment tooling 12 is adjusted by moving the adjustable alignment fixtures 18a–d toward or away from the oppositely positioned adjustable alignment fixture, thereby decreasing or increasing the area of the recess 22. That is, adjustable alignment fixtures 118a and 18c may be moved along the axis 26, and adjustable alignment fixtures 18b and 18d may be moved along the axis 28, to position the respective alignment surfaces 20a–d and define a recess 22 having an appropriate shape and size with respect to a packaged semiconductor device.

For example, a packaged device 70 has a shape and size defined by a length 72, a width 74, and a height 76. The adjustable alignment fixtures 18a–d are shown in FIG. 2 as being positioned to define a recess 22 and a surface 24 having nearly the same dimensions as the length 72 and the width 74. Thus, when the packaged device 70 is placed into the recess 22 it will be coarsely aligned. Although the alignment surfaces 20a–d do not fully enclose the recess 22, the flat surfaces of the alignment surfaces have a length sufficient to properly orient the packaged device 70 when placed into the recess 22.

Figure 3:
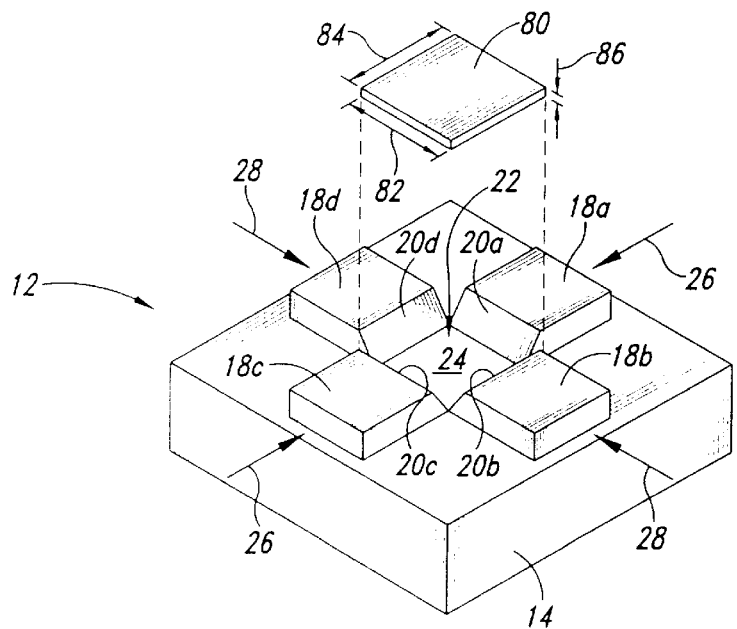
FIG. 3 is an isometric view of the coarse alignment tooling of FIG. 2.

Now consider a packaged device 80, as shown in FIG. 3, having a length 82, a width 84, and a height 86, where the length 82 and the width 84 is less than the length 72 and width 74, respectively. The packaged device 80 will not be coarsely aligned if placed into the recess 22 because the dimensions of the recess 22 are too great to properly orient the packaged device 80.

In order for the adjustable alignment tooling 12 to correctly align the packaged device 80, the adjustable alignment fixtures 18a–d should be positioned so that the respective alignment surfaces 20a–d define a recess 22 and a surface 24 having nearly the same dimensions as the length 82 and the width 84. This can be accomplished by moving the alignment fixtures 118a and 18c toward one another along the axis 26 until the distance separating the alignment surfaces 20a and 20c along the surface 24 is slightly less than the width 84. Similarly, the alignment fixtures 18b and 18d should be moved toward one another along the axis 28 until the distance separating the alignment surfaces 20b and 20d along the surface 24 is slightly less than the length 82. When the adjustable alignment fixtures 18a–d are positioned in such a manner, the packaged device 80 will be coarsely aligned to the proper orientation when placed into the recess 22 and rests on the alignment surfaces 20a–d.

As will be appreciated by a person of ordinary skill in the art, the adjustable alignment tooling 12 may be adjusted to correctly align packaged devices having different rectangular shapes, as well as packaged devices having different sizes. For example, if only the width 74 were to decrease while the length 72 were to remain constant (FIG. 2), the adjustable alignment fixtures 118a and 18c could be moved toward one another along the axis 26 so that the packaged device 70 could still be correctly aligned by the adjustable alignment tooling 12 when positioned in the recess 22. Similarly, the adjustable alignment tooling 12 could have only two adjacent adjustable alignment fixtures and still accommodate packaged devices of various rectangular shapes and sizes. For example, with reference to FIG. 2, the alignment fixtures 118a and 18d would have fixed positions, while alignment fixtures 18b and 18c would remain adjustable along the axes 28 and 26, respectively. When correctly aligning a different shaped or sized packaged device, only adjustable alignment fixtures 18b and 18c would be adjusted to accommodate the new packaged device. One corner of the recess 22 is defined by the fixed alignment fixtures 118a and 18d, while the diagonal corner of the recess 22 is defined by the adjustable alignment fixtures 18b and 18c. By defining two corners of the recess 22, the new packaged device can be correctly aligned when placed into the resulting recess 22.

As illustrated above, the number of adjustable alignment fixtures may range from one to four, depending on the flexibility desired and the specific application. In the case where the adjustable alignment tooling 12 has only one adjustable alignment fixture, it can accommodate packaged devices having different dimensions only along one axis, that is, either a different length or width.

Figure 4A:
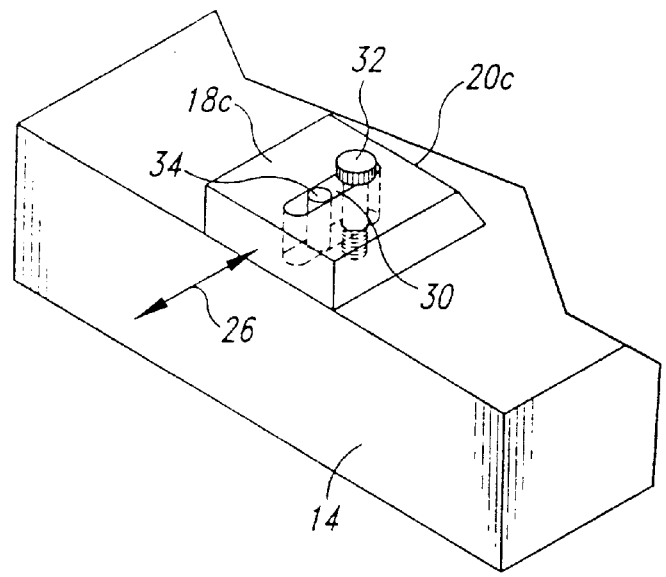
FIGS. 4A–D are partial isometric views of the coarse alignment tooling according to several embodiments of the present invention.

The adjustable alignment fixtures 18a–d may be positioned on and attached to the base 14 in a variety of manners. One example is shown in FIG. 4A with respect to the adjustable alignment fixture 18c. A slot 30 is formed through the alignment fixture 18c. A pin 34 is fixed to the base 14 and protrudes perpendicular to the surface of the base to fit into the slot 30. A screw 32 also fits through the slot 30 and threads into a threaded hole formed in the surface of the base 14. The pin 34 and the screw 32 are aligned along the axis 26. In this arrangement, movement of the adjustable alignment fixture 18c will be along the axis 26 when the screw 32 is loosened. After the adjustable alignment fixture 18c is properly positioned, the screw 32 is tightened snug so that the overlapping portion of the screw head contacting the upper surface of the adjustable alignment fixture 18c will hold it in place. If so desired, the pin 34 may be replaced by a second screw if a second threaded hole is formed into the base 14.

Figure 4B:
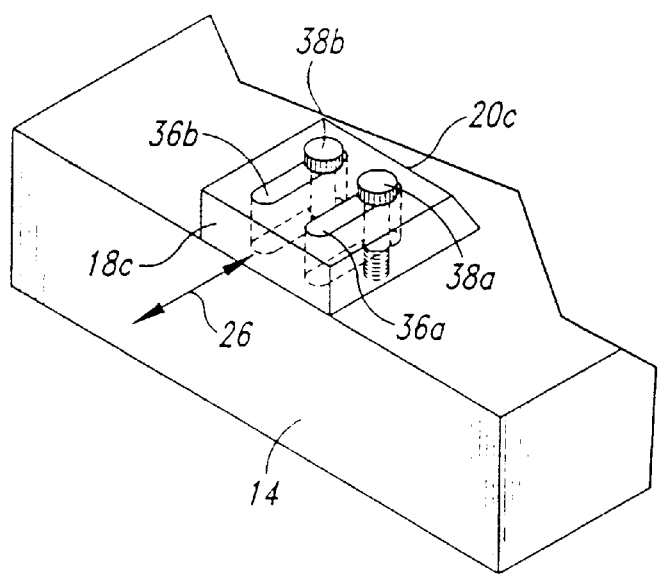

Another arrangement for attaching the adjustable alignment fixtures 18a–d to the base 14 is shown in FIG. 4B with respect to the adjustable alignment fixture 18c. Two slots 36a and 36b are formed through the alignment fixture 18c. The two slots 36a and 36b are formed laterally from each other and parallel to the axis 26. Two screws 318a and 38b fit through slots 36a and 36b, respectively, and thread into threaded holes formed in the base 14. The alignment fixture 118a may be moved in a direction along the axis 26 when the screws 318a and 38b are loosened. Once correctly positioned, the alignment fixture 118a may be held in place by tightening the screws 318a and 38b snug against the upper surface of the alignment fixture 118a.

Figure 4C:
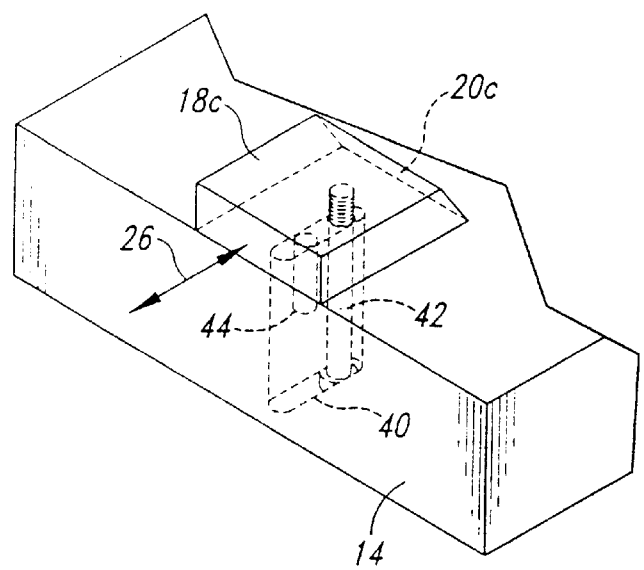

The adjustable alignment fixtures 18a–d may also be attached to the base 14 through the arrangement shown in FIG. 4C with respect to alignment fixture 18c. A slot 40 is formed through the base 14. A screw 42 is fit through the slot 40 and threads into a threaded hole formed into the lower surface of the alignment fixture 18c. A recessed region is also formed in the base 14 along the slot 40 to accommodate the head of the screw 42. A pin 44 protrudes perpendicularly from the lower surface of the alignment fixture 18c and fits into the slot 40. The pin 44 and the screw 42 are both aligned along the axis 26 to ensure that movement of the alignment fixture 18c is along the axis 26. The alignment fixture 18c may be adjusted to the correct position and held in place by tightening the screw 42 snug.

Figure 4D:
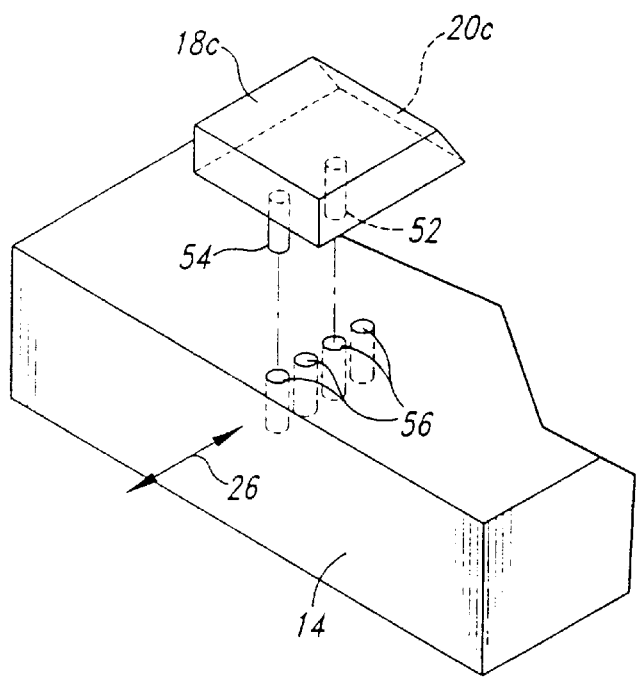

The adjustable alignment fixtures 18a–d may also be attached to the base 14 through the arrangement illustrated in FIG. 4D with respect to alignment fixture 18c. Two pins 52, 54 protruding from the bottom surface of the adjustable alignment fixture 18c fit into a series of evenly spaced holes 56 formed in the surface of the base 14. The alignment fixture 18c can be moved by lifting it away from the surface of the base 14 until the two pins 52, 54 are removed from the holes 56. The alignment fixture 18c is then repositioned by reinserting the pins 52, 54 into another set of the holes 56. The frictional fit between the pins 52, 54 and the holes 56 will prevent the alignment fixture from being inadvertently removed.

Figure 5:
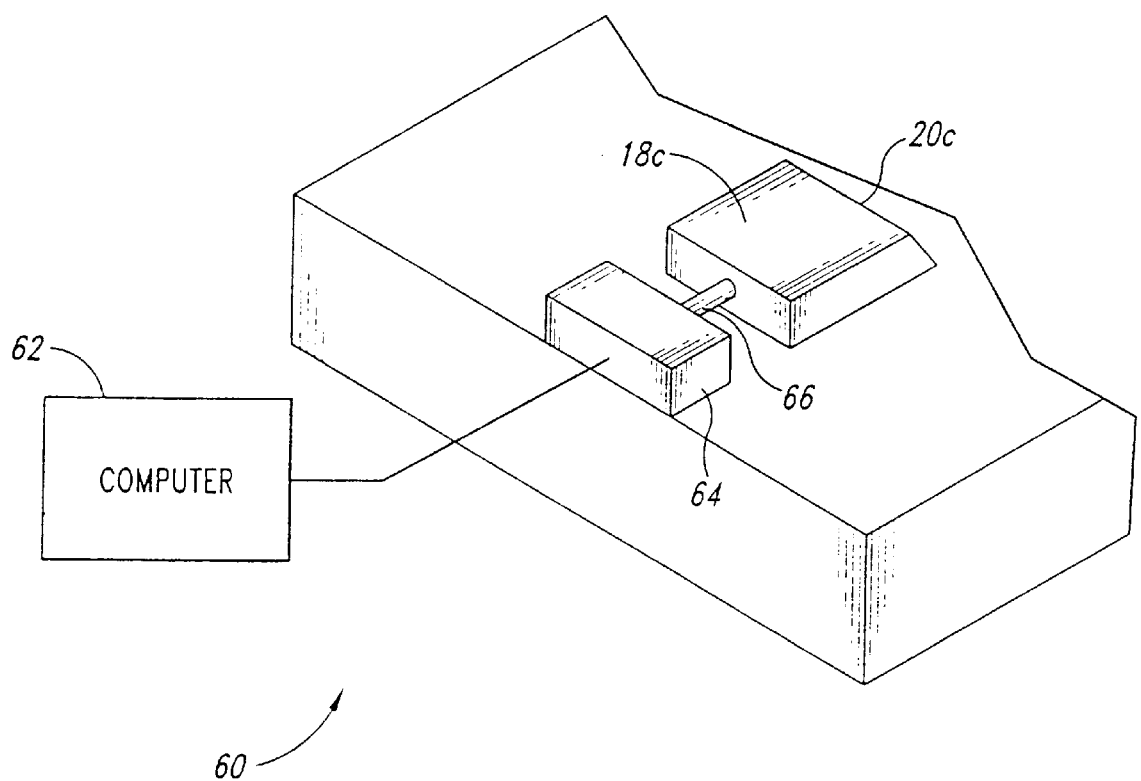
FIG. 5 is an block isometric view of an automated coarse alignment tooling according to another embodiment of the present invention.

The movement of the adjustable alignment fixtures 18a–d may also be performed through automated means, as shown in FIG. 5, if the alignment fixtures 18a–d are coupled to a computer driven actuating system 60. Such an arrangement allows the adjustable alignment tooling 12 to be quickly adjusted to accommodate a variety of rectangular shaped device packages. A computer driven actuation system having a computer 62 and an actuator 64 may be incorporated into a handler so that the computer 62 may be programmed to move the adjustable alignment fixtures 18a–d via connecting arm 66 to predetermined positions whenever a different shaped packaged device is tested. An automated actuation system as described is well known in the art, and may be employed in the precising systems utilized in singulated handling equipment described previously.

Although specific arrangements of attaching the adjustable alignment fixtures 18a–d to the base 14 have been provided above, the principles of the present invention are applicable regardless of the specific form of attachment. Accordingly, the present invention is not limited by the specific method of attaching the adjustable alignment fixtures 18a–d to the base 14.

A person of ordinary skill in the art will appreciate that the minimum size of the recess 22 defined by the adjustable alignment fixtures 18a–d is limited by the length of the respective alignment surfaces 20a–d. The minimum size of the recess 22 will result when the adjustable alignment fixtures 18a–d are moved toward one another until the adjacent alignment fixtures butt against the alignment fixture being moved. This situation is illustrated in FIG. 3. However, the adjustable alignment fixtures 18a–d may be replaced with adjustable alignment fixtures having alignment surfaces 20a–d with decreased widths. Consequently, the respective adjustable alignment fixtures 18a–d may be moved closer together to accommodate smaller packaged devices.

Figure 6:
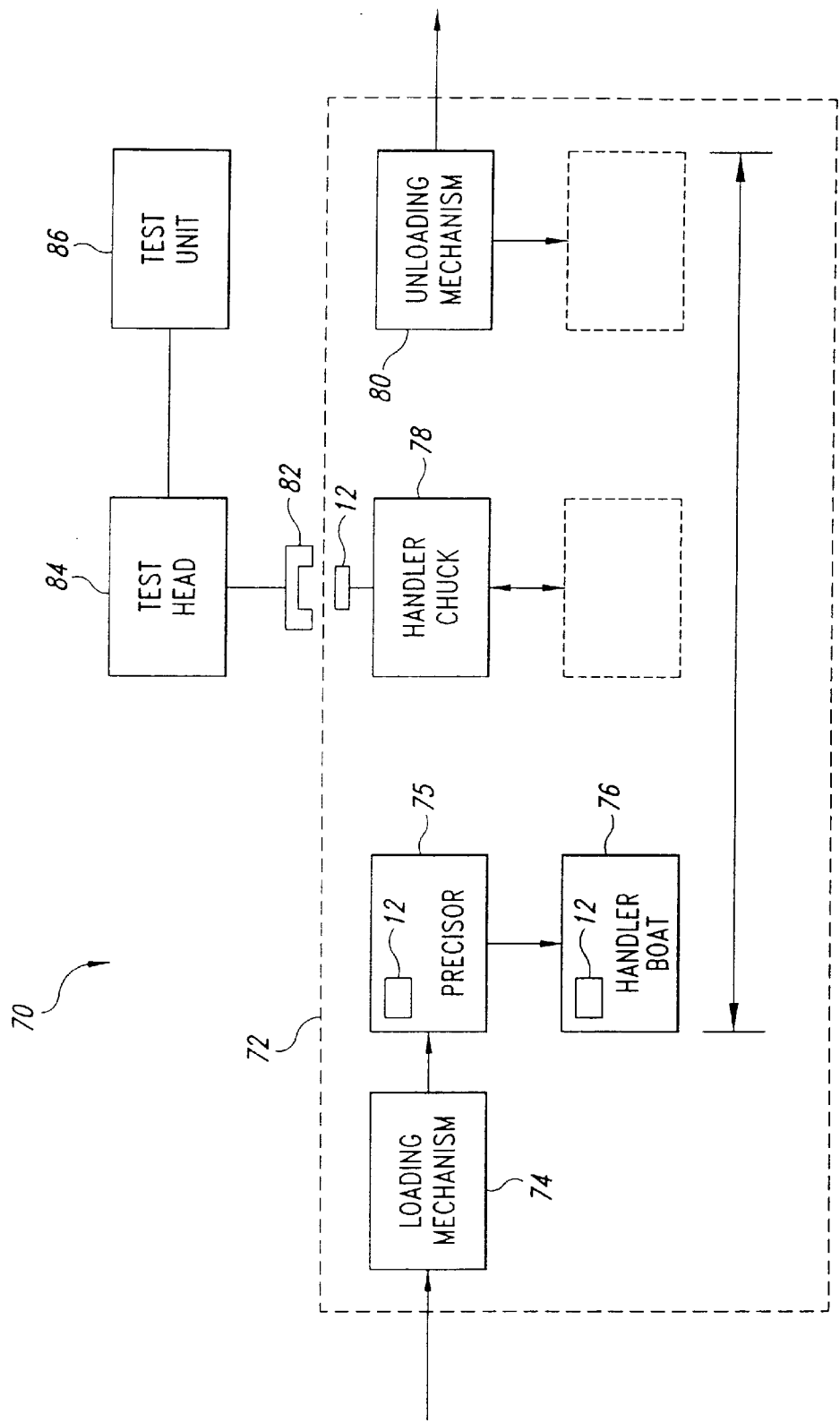
FIG. 6 is a block diagram of a test system including an automated handler having the coarse alignment tooling of FIG. 2.

Shown in FIG. 6 is a block diagram of a test system 70 for packaged semiconductor devices. An automated handler 72 includes a loading mechanism 74 that loads packaged semiconductor devices into the automated handler 72. The devices are placed into a precisor 75 to be coarsely aligned. The precisor includes an embodiment of an adjustable alignment tooling 12 according to the principles of the present invention. A handler boat 76 receives the packaged devices from the precisor 75 and provides the device to a handler chuck 78. The handler boat 76 also includes an embodiment of the adjustable alignment tooling 12 so that the device is coarsely aligned when transferred to the handler chuck 78. The handler chuck 78 receives the device from the handler boat 76 and positions the device in physical proximity to a test head 84 having a contactor 82. As mentioned previously, when the device comes into contact with the contactor 82, electrical signals generated by a test unit 86 may be applied to the device. In order to correctly position the device within the contactor 82, the handler chuck also includes an embodiment of the adjustable alignment tooling 12 that aligns the device with respect to the contactor 82. After testing of the device is complete, the handler chuck 78 withdraws the device from the contactor 82, and returns the device to the handler boat 76. The handler boat 76 receives the device and provides the device to an unloading mechanism 80, which unloads the device from the automated handler 72 and returns the device to a carrying tray.

From the foregoing it will be appreciated that although specific embodiments of the invention have been described herein for purposes of illustration, various modifications may be made without deviating from the spirit and scope of the invention. For example, the adjustable alignment fixtures 118*a–d* have been shown as being positioned to align a packaged device having a square shape. However, the adjustable alignment fixtures 18*a–d* may be adjusted for a packaged device having a rectangular shape as well. Furthermore, the present invention has been described with respect to handling a packaged device during testing. However, some or all of the principles of the present invention are applicable to other operations where singulated packaged device handling equipment is used. For example, tape and reel, device inspection, and packing operations. Furthermore, as will be appreciated by one skilled in the art, a plurality of adjustable alignment toolings according to the embodiments described previously may be used together to facilitate the mass production of semiconductor devices. For example, with reference to FIG. 6, the precisor 75, handler boat 76, and the handler chuck 78, may each include more than one adjustable alignment tooling 12 so that several semiconductor devices may be tested simultaneously. Accordingly, the invention is not limited except as by the appended claims.

What is claimed is:

1. An automated handler for positioning an integrated circuit, comprising:
    a loading mechanism for receiving and loading the integrated circuit into the automated handler;
    a handler boat for receiving the integrated circuit after being loaded into the automated handler by the loading mechanism and for transporting the integrated circuit within the handler, the handler boat having an adjustable singulated positioning apparatus having
    a base having an upper surface; and
    an adjustable guide having a plurality of guide members that define therebetween a recess into which the integrated circuit is placed for positioning, a first guide member being detachably coupled to the upper surface of the base and having an adjustable position along a first axis to adjust the shape or size of the recess;
    an electrical-mechanical actuation system having a positioning mechanism coupled to the adjustable guide to position the adjustable guide according to a control signal;
    a controller system coupled to the electrical-mechanical actuation system to generate and provide a control signal to the electrical-mechanical actuation system to position the adjustable guide;
    a handler chuck for receiving the integrated circuit from the handler boat and for positioning the integrated circuit in a predetermined orientation; and
    an unloading mechanism for receiving the integrated circuit after being positioned by the handler-chuck and for unloading the integrated circuit from the automated handler.

2. The automated handler of claim 1, further comprising a precisor for receiving the integrated circuit from the loading mechanism and for coarsely aligning the integrated circuit prior to being transferred to the handler boat, the precisor having an adjustable singulated positioning apparatus comprising:
    a base having an upper surface; and
    an adjustable guide having a plurality of guide members that define therebetween a recess into which the integrated circuit is placed for positioning, at least one of the guide members being releasably coupled to the upper surface of the base and having respective adjustable positions to adjust the shape or size of the recess.

3. The automated handler of claim 1 wherein the handler chuck comprises an adjustable singulated positioning apparatus having
    a base having an upper surface; and
    an adjustable guide having a plurality of guide members that define therebetween a recess into which the integrated circuit is placed for positioning, at least one of the guide members being releasably coupled to the upper surface of the base and having respective adjustable positions to adjust the shape or size of the recess.

4. The automated handler of claim 1, wherein a second guide member of the adjustable guide is detachably coupled to the upper surface of the base and has an adjustable position along a second axis, the second guide member positioned to partially define the recess into which the integrated circuit is placed for positioning.

5. The automated handler of claim 4 wherein the first and second guide members comprise first and second alignment surfaces, respectively, against which the integrated circuit butts when placed into the recess partially defined by the first and second alignment surfaces.

6. The automated handler of claim 5 wherein the first and second alignment surfaces are chamfered.

7. The automated handler of claim 1 wherein the first guide member is slidably attached to the base and is adjusted by sliding the guide member along the first axis into position to partially define the recess.

8. The automated handler of claim 1, wherein the adjustable guide of the handler boat further comprises second, third, and fourth guide members, each guide member detachably coupled to the upper surface of the base, the second and fourth guide members having an adjustable position along a second axis, and the third guide member having an adjustable position along the first axis, the first, second, third, and fourth guide members positioned to define the recess into which the integrated circuit is placed for alignment.

9. The apparatus of claim 8 wherein the first and second axes are orthogonal.

10. An automated handler for positioning an integrated circuit, comprising:
    a loading mechanism for receiving and loading the integrated circuit into the automated handler;
    a precisor for receiving the integrated circuit from the loading mechanism and for coarsely aligning the integrated circuit, the precisor having an adjustable singulated positioning apparatus including:

a precisor base having an upper surface; and an adjustable precisor guide having a plurality of guide members that define therebetween a recess into which the integrated circuit is placed for positioning, at least one of the guide members of the adjustable precisor guide being releasably coupled to the upper surface of the precisor base and having respective adjustable positions to adjust the shape or size of the recess;

a handler boat for receiving the integrated circuit from the precisor and for transporting the integrated circuit within the handler, the handler boat having an adjustable singulated positioning apparatus having:

a base having an upper surface; and an adjustable guide having a plurality of guide members that define therebetween a recess into which the integrated circuit is placed for positioning, a first guide member being detachably coupled to the upper surface of the base and having an adjustable position along a first axis to adjust the shape or size of the recess;

a handler chuck for receiving the integrated circuit from the handler boat and for positioning the integrated circuit in a predetermined orientation; and an unloading mechanism for receiving the integrated circuit after being positioned by the handler chuck and for unloading the integrated circuit from the automated handler.

11. The automated handler of claim 10 wherein the handler chuck comprises an adjustable singulated positioning apparatus having a base having an upper surface; and an adjustable guide having a plurality of guide members that define therebetween a recess into which the integrated circuit is placed for positioning, at least one of the guide members being releasably coupled to the upper surface of the base and having respective adjustable positions to adjust the shape or size of the recess.

12. The automated handler of claim 10, further comprising:

an electrical-mechanical actuation system having a positioning mechanism coupled to the adjustable guide of the handler boat to position the adjustable guide according to a control signal; and a controller system coupled to the electrical-mechanical actuation system to generate and provide a control signal to the electrical-mechanical actuation system to position the adjustable guide of the handler boat.

13. The automated handler of claim 10 wherein a second guide member of the adjustable guide of the handler boat is detachably coupled to the upper surface of the base and has an adjustable position along a second axis, the second guide member positioned to partially define the recess into which the integrated circuit is placed for positioning.

14. The automated handler of claim 13 wherein the first and second guide members comprise first and second alignment surfaces, respectively, against which the integrated circuit butts when placed into the recess partially defined by the first and second alignment surfaces.

15. The automated handler of claim 14 wherein the first and second alignment surfaces are chamfered.

16. The automated handler of claim 10 wherein the first guide member of the adjustable guide of the handler boat is slidably attached to the base and is adjusted by sliding the guide member along the first axis into position to partially define the recess.

17. The automated handler of claim 10 wherein the adjustable guide of the handler boat further comprises second, third, and fourth guide members, each guide member detachably coupled to the upper surface of the base, the second and fourth guide members having an adjustable position along a second axis, and the third guide member having an adjustable position along the first axis, the first, second, third, and fourth guide members positioned to define the recess into which the integrated circuit is placed for alignment.

18. The apparatus of claim 17 wherein the first and second axes are orthogonal.

19. An automated handler for positioning an integrated circuit, comprising:

a loading mechanism for receiving and loading the integrated circuit into the automated handler;

a handler boat for receiving the integrated circuit after being loaded into the automated handler by the loading mechanism and for transporting the integrated circuit within the handler, the handler boat having an adjustable singulated positioning apparatus having a base having an upper surface; and an adjustable guide having a plurality of guide members that define therebetween a recess into which the integrated circuit is placed for positioning, a first guide member being detachably coupled to the upper surface of the base and having an adjustable position along a first axis to adjust the shape or size of the recess;

a handler chuck for receiving the integrated circuit from the handler boat and for positioning the integrated circuit in a predetermined orientation, the handler chuck having an adjustable singulated positioning apparatus that includes a handler chuck base having an upper surface; and an handler chuck adjustable guide having a plurality of guide members that define therebetween a recess into which the integrated circuit is placed for positioning, at least one of the guide members being releasably coupled to the upper surface of the handler chuck base and having respective adjustable positions to adjust the shape or size of the recess; and an unloading mechanism for receiving the integrated circuit after being positioned by the handler chuck and for unloading the integrated circuit from the automated handler.

20. The automated handler of claim 19, further comprising:

an electrical-mechanical actuation system having a positioning mechanism coupled to the adjustable guide of the handler boat to position the adjustable guide according to a control signal; and a controller system coupled to the electrical-mechanical actuation system to generate and provide a control signal to the electrical-mechanical actuation system to position the adjustable guide of the handler boat.

21. The automated handler of claim 19 wherein a second guide member of the adjustable guide of the handler boat is detachably coupled to the upper surface of the base and has an adjustable position along a second axis, the second guide member positioned to partially define the recess into which the integrated circuit is placed for positioning.

22. The automated handler of claim 21 wherein the first and second guide members comprise first and second alignment surfaces, respectively, against which the integrated circuit butts when placed into the recess partially defined by the first and second alignment surfaces.

23. The automated handler of claim 22 wherein the first and second alignment surfaces are chamfered.

24. The automated handler of claim 19 wherein the first guide member of the adjustable guide of the handler boat is slidably attached to the base and is adjusted by sliding the guide member along the first axis into position to partially define the recess.

25. The automated handler of claim 19 wherein the adjustable guide of the handler boat further comprises second, third, and fourth guide members, each guide member detachably coupled to the upper surface of the base, the second and fourth guide members having an adjustable position along a second axis, and the third guide member having an adjustable position along the first axis, the first, second, third, and fourth guide members positioned to define the recess into which the integrated circuit is placed for alignment.

26. The apparatus of claim 25 wherein the first and second axes are orthogonal.

27. An automated handler for positioning an integrated circuit, comprising:
 a loading mechanism for receiving and loading the integrated circuit into the automated handler;
 a handler boat for receiving the integrated circuit after being loaded into the automated handler by the loading mechanism and for transporting the integrated circuit within the handler, the handler boat having an adjustable singulated positioning apparatus having
  a base having an upper surface; and
  an adjustable guide having first, second, third, and fourth adjustable guide members that define therebetween a recess into which the integrated circuit is placed for alignment, each guide member detachably coupled to the upper surface of the base, the first and third guide members having adjustable positions along a first axis and the second and fourth guide members having an adjustable position along a second axis to adjust the shape or size of the recess into which the integrated circuit is placed;
 a handler chuck for receiving the integrated circuit from the handler boat and for positioning the integrated circuit in a predetermined orientation; and
 an unloading mechanism for, receiving the integrated circuit after being positioned by the handler chuck and for unloading the integrated circuit from the automated handler.

28. The automated handler of claim 27, further comprising a precisor for receiving the integrated circuit from the loading mechanism and for coarsely aligning the integrated circuit prior to being transferred to the handler boat, the precisor having an adjustable singulated positioning apparatus comprising:
 a base having an upper surface; and
 an adjustable guide having a plurality of guide members that define therebetween a recess into which the integrated circuit is placed for positioning, at least one of the guide members being releasably coupled to the upper surface of the base and having respective adjustable positions to adjust the shape or size of the recess.

29. The automated handler of claim 27 wherein the handler chuck comprises an adjustable singulated positioning apparatus having
 a base having an upper surface; and
 an adjustable guide having a plurality of guide members that define therebetween a recess into which the integrated circuit is placed for positioning, at least one of the guide members being releasably coupled to the upper surface of the base and having respective adjustable positions to adjust the shape or size of the recess.

30. The automated handler of claim 27, further comprising:
 an electrical-mechanical actuation system having a positioning mechanism coupled to the adjustable guide of the handler boat to position the adjustable guide according to a control signal; and
 a controller system coupled to the electrical-mechanical actuation system to generate and provide a control signal to the electrical-mechanical actuation system to position the adjustable guide of the handler boat.

31. The automated handler of claim 27 wherein the first and second guide members comprise first and second alignment surfaces, respectively, against which the integrated circuit butts when placed into the recess partially defined by the first and second alignment surfaces.

32. The automated handler of claim 31 wherein the first and second alignment surfaces are chamfered.

33. The automated handler of claim 27 wherein the first guide member of the adjustable guide of the handler boat is slidably attached to the base and is adjusted by sliding the guide member along the first axis into position to partially define the recess.

34. The apparatus of claim 27 wherein the first and second axes are orthogonal.

* * * * *

UNITED STATES PATENT AND TRADEMARK OFFICE
CERTIFICATE OF CORRECTION

PATENT NO. : 6,446,951 B2
DATED : September 10, 2002
INVENTOR(S) : Jim Nuxoll and Julian Aberasturi It is certified that error appears in the above-identified patent and that said Letters Patent is hereby corrected as shown below:

Title page,
Item [57], ABSTRACT,
Line 11, "device is to placed" should read -- device is to be placed --

Column 1,
Line 63, "has a series conductors" should read -- has a series of conductors --

Column 2,
Line 22, "by chambered surfaces" should read -- by chamfered surfaces --
Line 23, "by the chambered surfaces" should read -- by the chamfered surfaces --
Line 24, "rests on either on the" should read -- rests either on the --
Line 26, "The chambered surfaces" should read -- The chamfered surfaces --

Column 3,
Line 14, "device is to placed" should read -- device is to be placed --
Line 28, "is an block isometric" should read -- is a block isometric --

Column 4,
Line 18, "fixtures 118a," should read -- fixtures 18a, --
Line 25, "fixtures 118 and" should read -- fixtures 18a and --
Line 55, "fixtures 118 and" should read -- fixtures 18 and --

Column 5,
Lines 5, 13 and 19, "fixtures 118a and" should read -- fixtures 18a and --
Line 18, "One comer" should read -- One corner --
Line 20, "diagonal comer" should read -- diagonal corner --
Line 22, "two comers" should read -- two corners --
Line 54, "Two screws 318a" should read -- Two screws 38a --
Line 57, "118a may be" should read -- 18a may be --
Lines 58 and 60, "screws 318a and 38b" should read -- screws 38a and 38b --
Line 61, "alignment fixture 118a." should read -- alignment fixture 18a. --

UNITED STATES PATENT AND TRADEMARK OFFICE
CERTIFICATE OF CORRECTION

PATENT NO. : 6,446,951 B2
DATED : September 10, 2002
INVENTOR(S) : Jim Nuxoll and Julian Aberasturi It is certified that error appears in the above-identified patent and that said Letters Patent is hereby corrected as shown below:

Column 7,
Line 24, "118*a-d* have" should read -- 18*a-d* have --

Signed and Sealed this

Nineteenth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,446,951 B2
DATED : September 10, 2002
INVENTOR(S) : Jim Nuxoll and Julian Aberasturi It is certified that error appears in the above-identified patent and that said Letters Patent is hereby corrected as shown below:

Title page,
Item [57], ABSTRACT,
Line 11, "device is to placed" should read -- device is to be placed --

Column 1,
Line 63, "has a series conductors" should read -- has a series of conductors --

Column 2,
Line 22, "by chambered surfaces" should read -- by chamfered surfaces --
Line 23, "by the chambered surfaces" should read -- by the chamfered surfaces --
Line 24, "rests on either on the" should read -- rests either on the --
Line 26, "The chambered surfaces" should read -- The chamfered surfaces --

Column 3,
Line 14, "device is to placed" should read -- device is to be placed --
Line 28, "is an block isometric" should read -- is a block isometric --

Column 4,
Line 18, "fixtures 118$a$," should read -- fixtures 18$a$, --
Line 25, "fixtures 118$a$ and" should read -- fixtures 18$a$ and --
Line 55, "fixtures 118$a$ and" should read -- fixtures 18$a$ and --

Column 5,
Lines 5, 13 and 19, "fixtures 118$a$ and" should read -- fixtures 18$a$ and --
Line 18, "One comer" should read -- One corner --
Line 20, "diagonal comer" should read -- diagonal corner --
Line 22, "two comers" should read -- two corners --
Line 54, "Two screws 318$a$" should read -- Two screws 38$a$ --
Line 57, "118$a$ may be" should read -- 18$a$ may be --
Lines 58 and 60, "screws 318$a$ and 38$b$" should read -- screws 38$a$ and 38$b$ --
Line 61, "alignment fixture 118$a$." should read -- alignment fixture 18$a$. --
Line 59, "fixture 118$a$ may" should read -- fixture 18$a$ may --

UNITED STATES PATENT AND TRADEMARK OFFICE
CERTIFICATE OF CORRECTION

PATENT NO.   : 6,446,951 B2
DATED        : September 10, 2002
INVENTOR(S)  : Jim Nuxoll and Julian Aberasturi It is certified that error appears in the above-identified patent and that said Letters Patent is hereby corrected as shown below:

<u>Column 7,</u>
Line 24, "118$a$-$d$ have" should read -- 18$a$-$d$ have --

This certificate supersedes Certificate of Correction issued August 19, 2003.

Signed and Sealed this

Twenty-ninth Day of March, 2005

JON W. DUDAS
*Director of the United States Patent and Trademark Office*